United States Patent
Lao

(10) Patent No.: US 7,973,874 B2
(45) Date of Patent: Jul. 5, 2011

(54) FLAT PANEL DISPLAY AND BACKLIGHT MODULE THEREOF

(75) Inventor: Jun-Hsian Lao, Keelung (TW)

(73) Assignee: Au Optronics Corp., Hsinchu (TW)

( * ) Notice: Subject to any disclaimer, the term of this patent is extended or adjusted under 35 U.S.C. 154(b) by 0 days.

(21) Appl. No.: 12/389,573

(22) Filed: Feb. 20, 2009

(65) Prior Publication Data

US 2009/0153769 A1 Jun. 18, 2009

Related U.S. Application Data

(63) Continuation of application No. 11/104,339, filed on Apr. 12, 2005, now abandoned.

(30) Foreign Application Priority Data

Oct. 26, 2004 (TW) ................................ 93132345 A

(51) Int. Cl.
*G02F 1/1333* (2006.01)

(52) U.S. Cl. .......................................... 349/58; 349/149
(58) Field of Classification Search .................... None
See application file for complete search history.

(56) References Cited

U.S. PATENT DOCUMENTS

| | | | |
|---|---|---|---|
| 6,504,587 B1 | 1/2003 | Morishita et al. | |
| 6,583,843 B2 * | 6/2003 | Ishino | 349/149 |
| 7,184,117 B2 * | 2/2007 | Suzuki | 349/150 |
| 2002/0071085 A1 | 6/2002 | Huang et al. | |
| 2003/0234897 A1 | 12/2003 | Ozawa | |
| 2004/0114062 A1 | 6/2004 | Nishio et al. | |
| 2004/0169782 A1 | 9/2004 | Lai et al. | |
| 2005/0052588 A1 * | 3/2005 | Saito et al. | 349/58 |
| 2005/0088830 A1 * | 4/2005 | Yumoto et al. | 361/749 |

* cited by examiner

*Primary Examiner* — Lucy P Chien
(74) *Attorney, Agent, or Firm* — Thomas|Kayden

(57) ABSTRACT

A flat panel display and backlight module thereof. The backlight module comprises a frame, a flexible printed circuit board, and at least one electrical connection port. The flexible printed circuit board is encircled by the frame. The electrical connection port is disposed on the flexible printed circuit board, connecting the flexible printed circuit board and an external printed circuit board.

13 Claims, 6 Drawing Sheets

FLAT PANEL DISPLAY AND BACKLIGHT MODULE THEREOF

CROSS REFERENCE TO RELATED APPLICATIONS

This application is a Continuation of application Ser. No. 11/104,339, filed on Apr. 12, 2005.

BACKGROUND OF THE INVENTION

1. Field of the Invention

The invention relates to a flat panel display, and in particular to a flat panel display and a backlight module thereof.

2. Description of the Related Art

Flexible printed circuit board (FPCB) is widely used in electronic devices for electrical connection requiring elasticity and light weight, enabling internal space of electronics to be effectively utilized and convenient to assemble.

FIG. 1 is a schematic view of a conventional backlight 10 for a flat panel display. The conventional backlight 10 comprises a frame 11, a flexible printed circuit board 12, a light source (not shown), and other elements. The flexible printed circuit board 12 is generally long and thin, and disposed on a front side F' of the backlight module 10. A portion of the flexible printed circuit board 12 protrudes from the frame 11, connecting to other circuit boards in the flat panel display, providing signal transfer and power to a light source. Additionally, signals transmitted by or received from the backlight module 10 are transmitted via the flexible printed circuit board 12 to other interfaces of the flat panel display. Two conventional connection methods frequently used to connect the flexible printed circuit board and other circuit boards of the flat panel display are shown in FIGS. 2A and 2B, respectively.

FIG. 2A is a side view of an assembly of a printed circuit board 15 and a backlight module 10 of a conventional flat panel display 100. FIG. 2B is a side view of another assembly of a printed circuit board 15 and a backlight module 10 of the conventional flat panel display 100.

As shown in FIG. 2A, the flat panel display 100 comprises a printed circuit board 15 and a backlight module 10 disposed thereon. A flexible printed circuit board 12 for light source protrudes from the frame of the backlight module 10 and connects to the printed circuit board 15 via a connector 16.

The disadvantage of the design is that connector 16, having large volume, requires additional space, and thus, the connector 16 occupies most usable space on the circuit board 15 or the flexible circuit board 12. The connector must be assembled manually, whereby labor time and costs cannot be effectively controlled.

FIG. 2B is a schematic view of a flexible printed circuit board 12 for light source, welded to bare copper (not shown) of another printed circuit board 15 of a flat panel display by solder 17. In this method, since connectors are eliminated, material costs are reduced, but assembly time and costs cannot. Welding quality depends on skill and performance and can vary with the parameters of pressure welding, machines, and thickness of solder. Thus, connection quality is difficult to control. If the product must be repaired or reassembled, the flexible printed circuit board can possibly overheat, deform, or even break such that the product is irreparable. If assembly fails, materials are wasted, increasing assembly time, and assembly costs cannot be effectively controlled.

Note that, since the flexible printed circuit board protrudes from the frame to connect to an external circuit, strength of the frame is not strong enough, and when the frame is compromised, display quality of the flat panel is affected accordingly.

BRIEF SUMMARY OF THE INVENTION

Embodiments of the invention provide a flat panel display and a backlight module thereof to eliminate the shortcomings described such that the space in the circuit board is conserved, providing easy reassembly, low costs, and high quality control.

Further provided is a backlight module comprising a frame, a circuit board, and at least one electrical connection port. The circuit board is circumferentially encircled by the frame. The electrical connection port is disposed on the circuit board, connecting to an external circuit board.

The frame comprises at least one opening, corresponding to the electrical connection port, passing through the opening and exposed to the outside of the frame.

The electrical connection port comprises elastic conductor, metal elastic plate, or bare copper.

The electrical connection port is curved.

The circuit board comprises a flexible printed circuit board (FPCB) or printed circuit board (PCB).

Further provided is a flat panel display comprising a first circuit board, a first electrical connection port, a backlight module, and a panel. The first electrical connection port is disposed on a surface of the first circuit board. The backlight module, connected to the first circuit board, comprises a frame, a second circuit board, and a second electrical connection port. The second circuit board is encircled by the frame. The second electrical connection port is disposed on a surface of the second circuit board. The first electrical connection port contacts the second electrical connection port, connecting the second circuit board and the first circuit board. The panel is connected to the second circuit board.

BRIEF DESCRIPTION OF THE DRAWINGS

The invention can be more fully understood by reading the subsequent detailed description in conjunction with the examples and references made to the accompanying drawings, wherein.

DETAILED DESCRIPTION OF THE INVENTION

Figure 1:
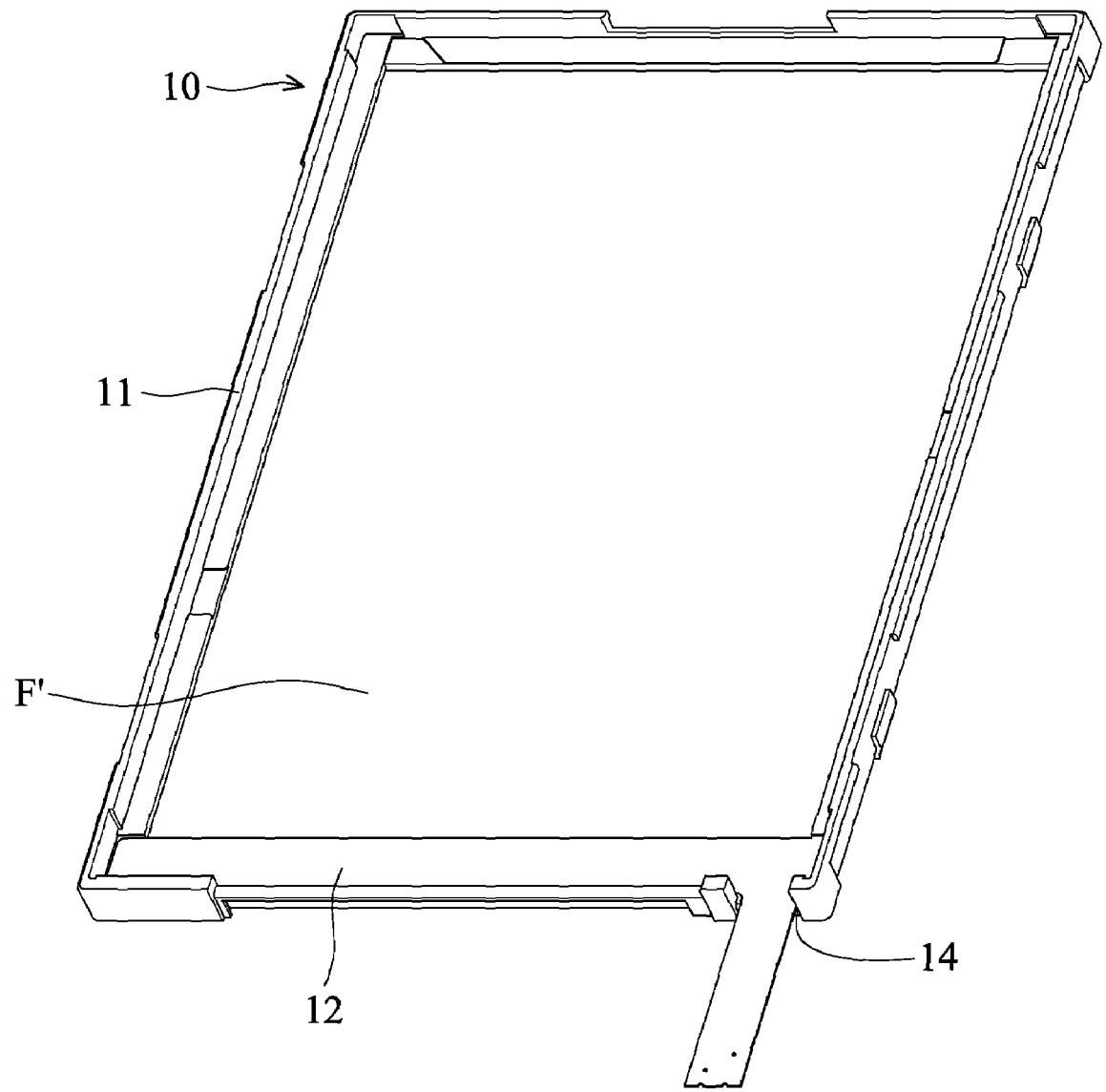
FIG. 1 is a schematic view of a conventional backlight module.
Figure 2A:
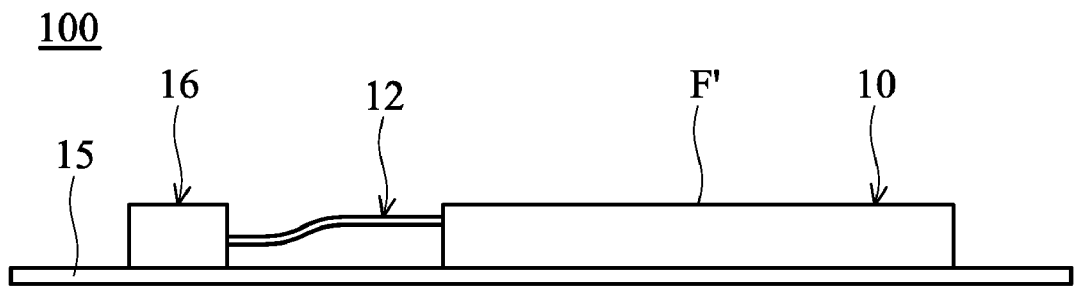
FIG. 2A is a side view of an assembly of a printed circuit board and a backlight module of a conventional flat panel display.
Figure 2B:
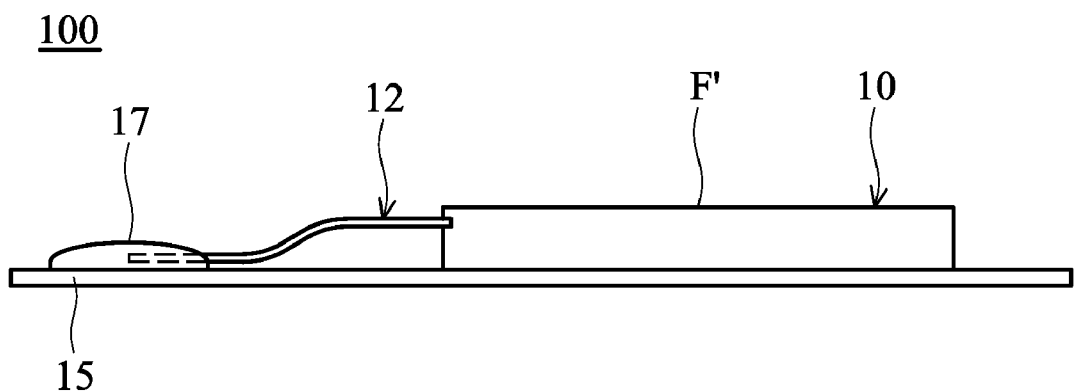
FIG. 2B is a side view of another assembly of a printed circuit board and a backlight module of the conventional flat panel display.
Figure 3A:
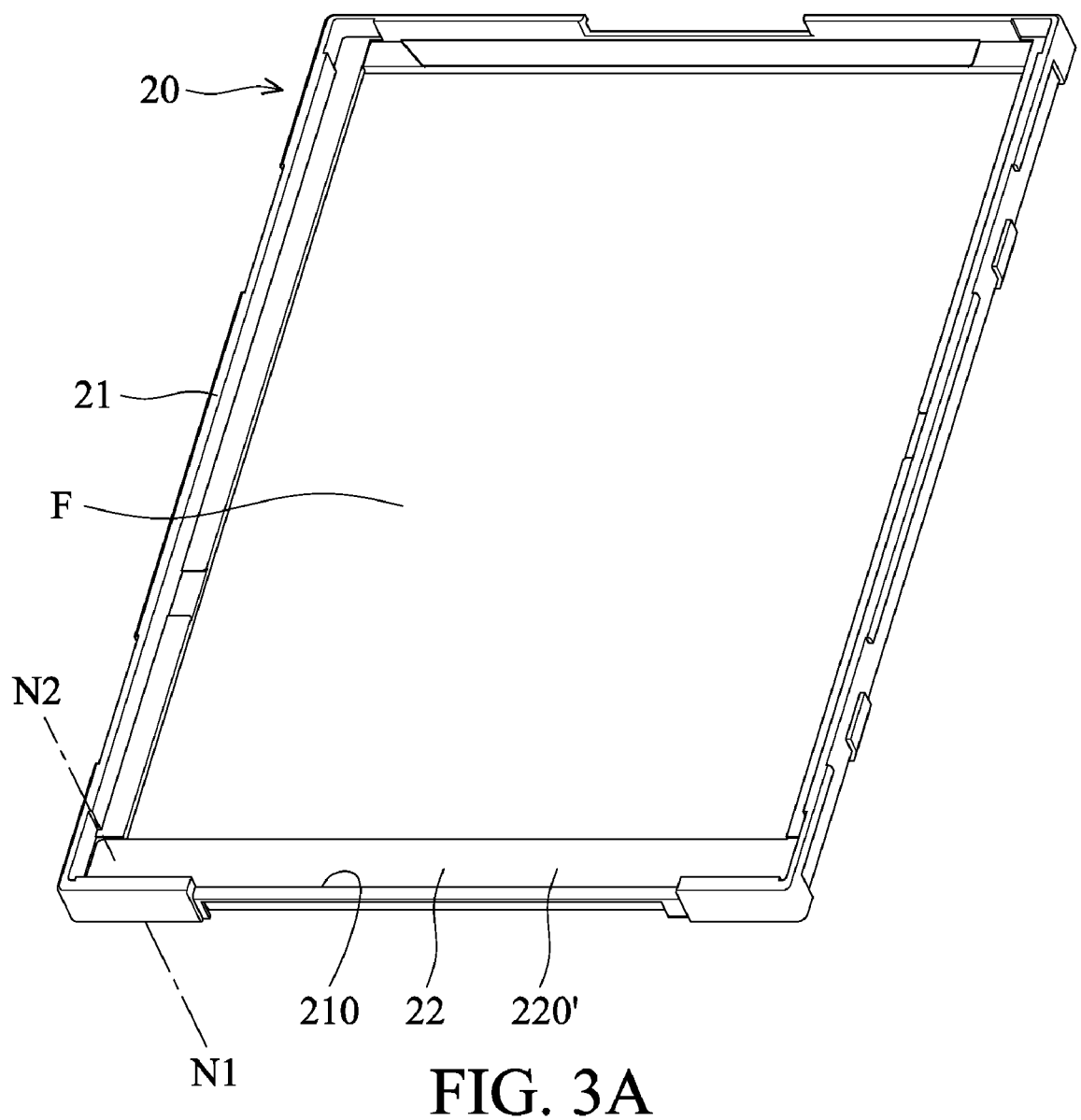
FIG. 3A is a schematic front view of a backlight module of an embodiment of the invention.
Figure 3B:
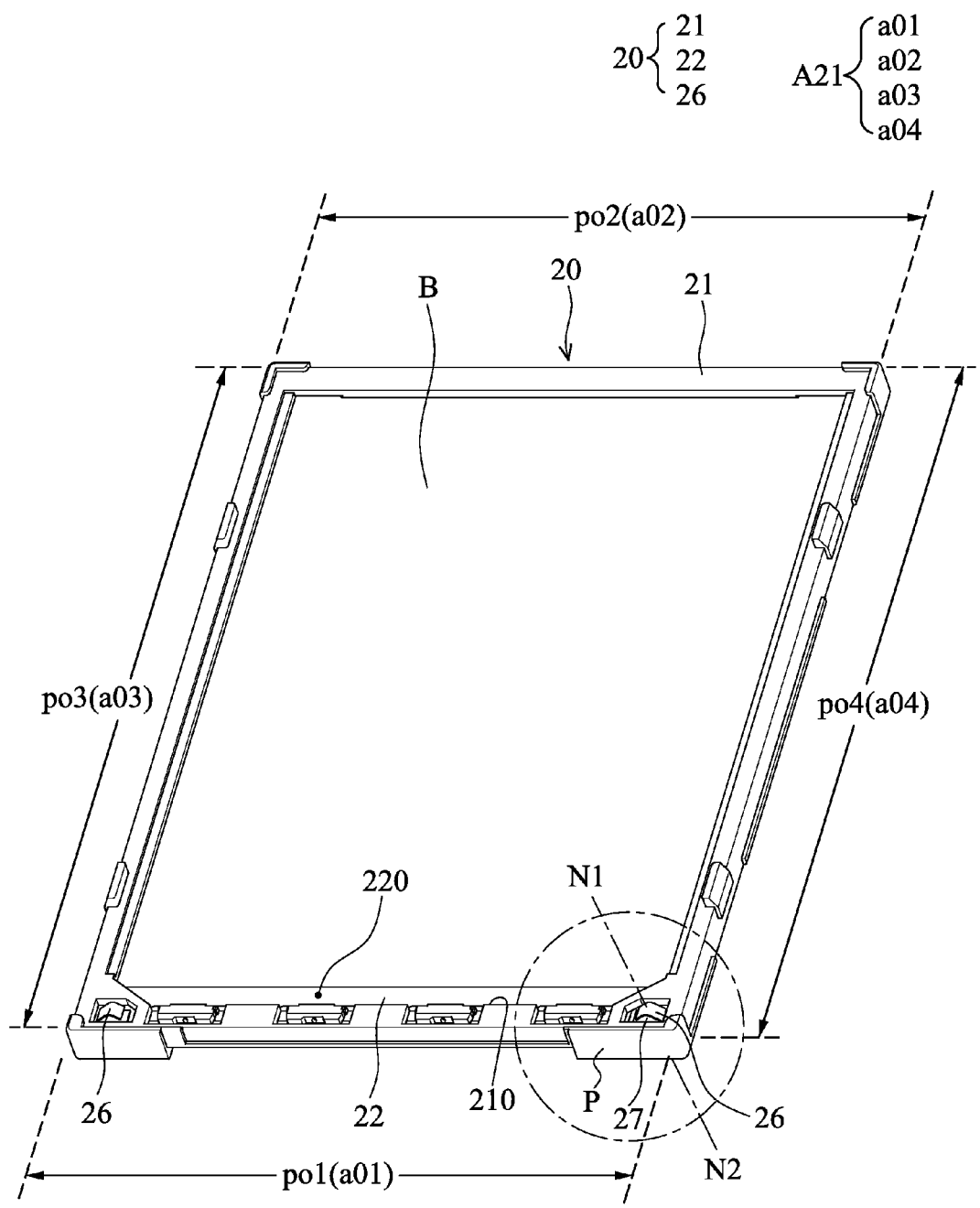
FIG. 3B is a schematic rear view of a backlight module of FIG. 3A.

FIG. 3A is a schematic view of a front side F of a backlight module 20 of an embodiment of the invention. FIG. 3B is a schematic view of rear side B of the backlight module 20 of FIG. 3A.

Note that the embodiment of the invention modifies connection between a flexible printed circuit board and an external circuit board in a flat panel display or a liquid crystal display, and thus, unrelated elements are eliminated from FIGS. 3A and 3B to clearly show the connection between flexible printed circuit board and the external circuit board.

As shown in FIGS. 3A and 3B, the backlight module 20 comprises a frame 21 having at least one opening, a flexible printed circuit board 22 having two surfaces 220 and 220', and at least one electrical connection port 26. The frame 21 has the front side F, the rear side B and a periphery side P. The frame 21 comprises four parts p01, p02, p03 and p04 which form a first opening 210 in the rear side B, wherein each part p01, p02, p03 and p04 has an area a01, a02, a03 and a04, respectively, and the part p01 has at least one second opening 27 in the rear side B. The areas a01, a02, a03 and a04 form a picture frame-shaped area A21 which is projected on a plane (not shown) and surrounds the first opening 210, wherein the portion (i.e., the part p01) of the picture frame-shaped area A21 has two second openings 27 thereinside. That is, the frame 21 has two separated openings, the first opening 210 and the second opening 27 disposed next to and much smaller than the first opening 210, and the first opening 210 and the second opening 27 are not connected to each other. The flexible printed circuit board 22 is connected to a light source (not shown), providing electric power thereto. The flexible printed circuit board 22 is disposed on the picture frame-shaped area A21 of the frame 21. That is, the flexible printed circuit board 22 disposed in the first opening 210 of the frame 21 is circumferentially encircled by the frame 21; that is, the first opening 210 of the frame 21 exposes both surfaces 220 and 220' of the flexible printed circuit board 22, and the flexible printed circuit board 22 does not protrude from the frame 21. Thus, the frame 21, requiring no notch for the flexible printed circuit board 22, provides increased strength. On the rear side B of the backlight module 20, the electrical connection port 26 is disposed or bonded on the flexible printed circuit board 22, connecting the flexible printed circuit board 22 and an external printed circuit board (reference symbols 25 and 35 shown in FIGS. 4 and 5) or a printed circuit board of a flat panel display. Note that only two electrical connection ports 26 are shown in FIG. 3B, disposed on two ends of the flexible printed circuit board 22, respectively. The invention, however, does not limit the quantity, position, or size of the flexible printed circuit board 22.

Figure 3C:
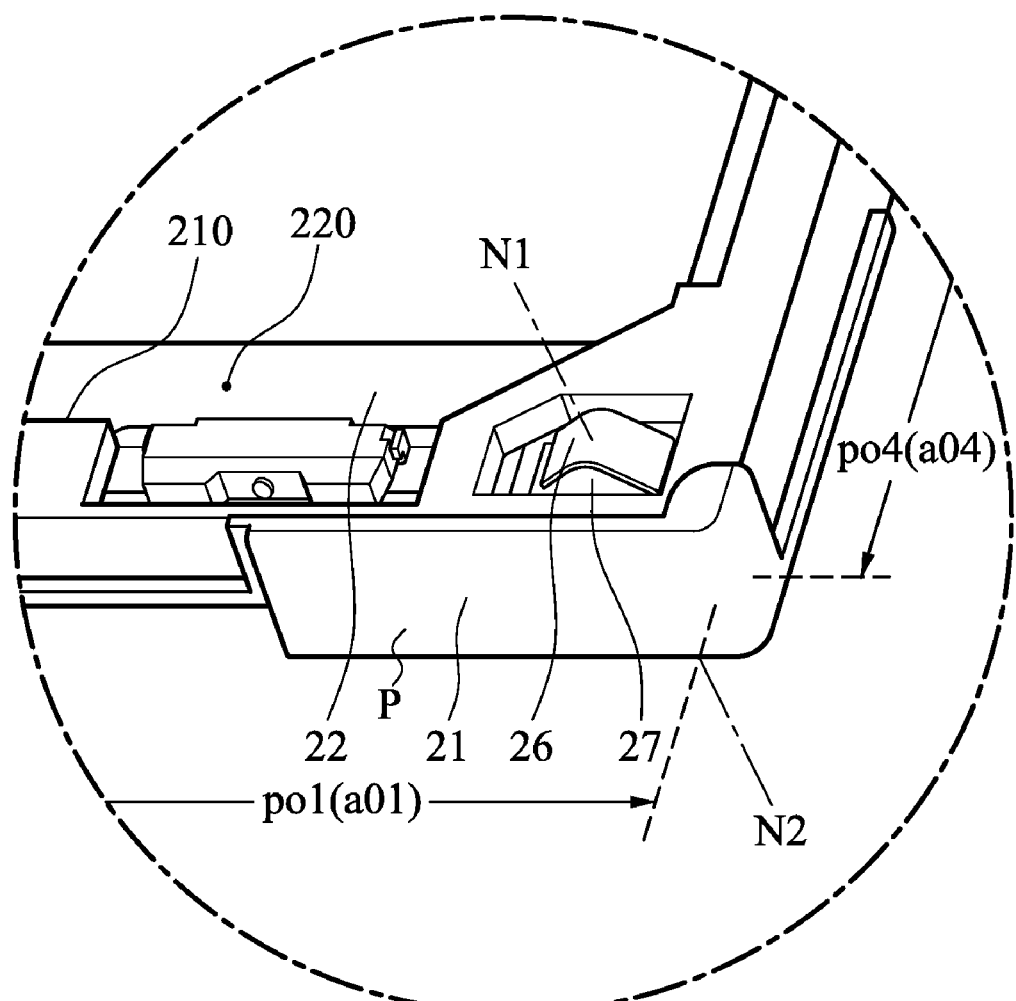
FIG. 3C is a local enlarged view of FIG. 3B.

FIG. 3C is a local enlarged view of FIG. 3B. As shown in FIG. 3C, the frame 21 second opening 27 formed on the rear side B thereof, corresponding to the electrical connection port 26 passing through the second opening 27 and exposed to the outside of the frame 21. The electrical connection port 26 comprises an elastic conductor such as a metal elastic plate, a curved metal plate.

Note that the electrical connection port 26, corresponding to and passing through the second opening 27 and not extending out of the periphery side P of the frame 21, is exposed to the outside of the frame 21, such that the second opening 27, the electrical connection port 26, and a place where the electrical connection port 26 connects to the external circuit board on the rear side B are arranged in one direction N1-N2, wherein the direction N1-N2 is substantially perpendicular to the surfaces 220 and 220' of the flexible printed circuit board 22.

Figure 4:
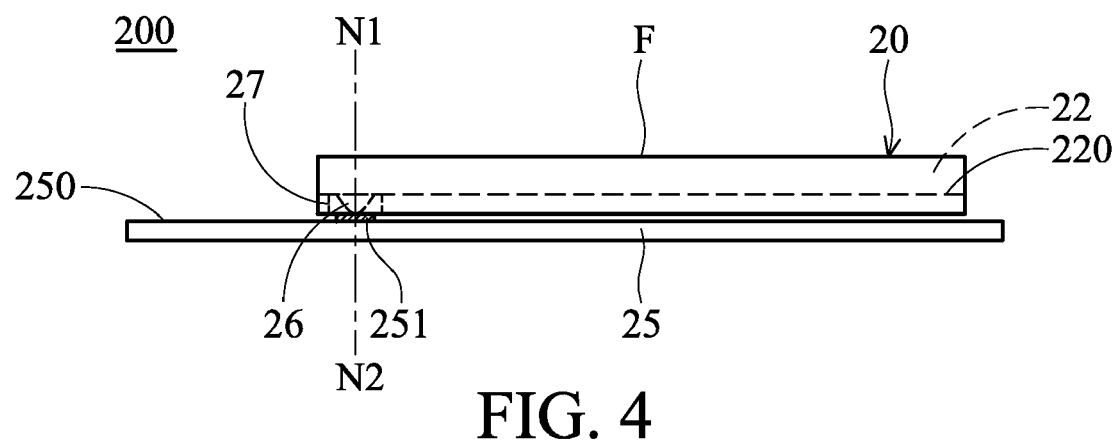
FIG. 4 is a side view of a printed circuit board and a backlight module assembled in a flat panel display of an embodiment of the invention.

FIG. 4 is a side view of a first circuit board (e.g. a printed circuit board, PCB)) 25 and a backlight module 20 assembled in a flat panel display 200 of an embodiment of the invention.

The first circuit board 25 has a surface 250 substantially paralleled to the rear side B. To distinguish from the flexible printed circuit board 22 from the first circuit board 25, the flexible printed circuit board 22 of the backlight module 20 is defined as a second circuit board. Note that other elements of the flat panel display 200 such as upper, lower covers, and panel are not shown to clearly show the connection. The panel can be a liquid crystal panel. In this embodiment, the flat panel display 200 further comprises the first circuit board 25 and a first electrical connection port 251, comprising bare copper. The first electrical connection port 251 is disposed on the surface 250 of the first circuit board 25. When the backlight module 20 is disposed on the first circuit board 25, since the electrical connection port 26 (second electrical connection port) of the backlight module 20 is a metal elastic plate, passing through the second opening 27 and exposed to the outside of the frame 21 and protruding to the first circuit board 25, the electrical connection port 26 of the backlight module 20 contacts the bare copper 251 of the first circuit board 25 to electrically connect the flexible printed circuit board 22 and the first circuit board 25.

Note that the electrical connection port 26, corresponding to and passing through the second opening 27 of the frame 21 of the backlight module 20, is exposed to the outside of the frame 21 of the backlight module 20, such that the second opening 27, the second electrical connection port 26 and a place where the second electrical connection port 26 connects to the first circuit board 25 are arranged in one direction N1-N2, wherein the direction N1-N2 is substantially perpendicular to the surface 220 of the second circuit board 22.

Additional space for the connector or welding portion is not required in the invention, and manual assembly of the connector and welding time are saved such that manufacturing time is reduced. Additionally, material costs of metal elastic plates are much less than those of connectors or solders with better quality control. Since the flexible printed circuit board and the PCB are not connected by welding, the device can be easily reassembled without any difficulties. The flexible printed circuit board is circumferentially encircled by the frame with no portion protruding therefrom such that the frame has higher strength, reducing material costs.

Figure 5:
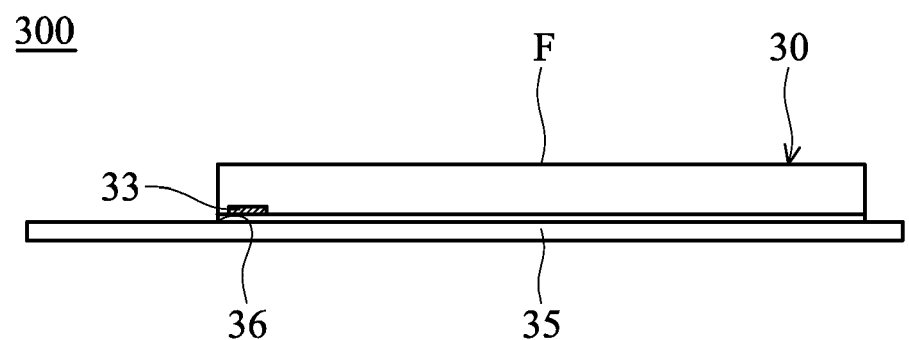
FIG. 5 is a side view of a printed circuit board and a backlight module assembled in a flat panel display of another embodiment of the invention.

FIG. 5 is a side view of a first circuit board (e.g. a printed circuit board, PCB)) 35 and a backlight module 30 assembled in a flat panel display 300 of another embodiment of the invention, in which elements other than the first circuit board 35 and the backlight module 30 are omitted.

In this embodiment, the backlight module 30 comprises a frame, a panel, a flexible printed circuit board, and at least one second electrical connection port 33, disposed on a surface of the flexible printed circuit board. The flat panel display 300 further comprises a first electrical connection port 36, disposed on a surface of the first circuit board 35. The backlight module 30 is connected to the first circuit board 25. The difference is that the first electrical connection port 36 of the first circuit board 35 comprises an elastic conductor such as a metal elastic plate or a curved elastic plate, protruding to the backlight module 30. The second electrical connection port 33 comprises bare copper. The first electrical connection port 36 contacts the second electrical connection port 33, connecting the flexible printed circuit board (not shown) in the backlight module 30 and the first circuit board 35 of the flat panel display 300.

Hence, in the modified connection structure of the invention, direct contact between two electrical connection ports 36 and 33 conserves the space on the circuit board, providing easy reassembly, low costs, and high quality control, while increasing strength of the frame of the backlight module.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements

What is claimed is:

1. A backlight module, comprising:
    a frame, having a rear side and a periphery side, comprising a plurality of parts forming a first opening in the rear side, wherein each one of the parts has an area and one of the parts has at least one second opening in the rear side;
    a circuit board, disposed on the one of the parts, and an area of the circuit board is located inside the area of the one of the parts of the frame; and
    at least one electrical connection port, disposed on the circuit board, connecting the circuit board and an external circuit board on the rear side, and not extending out of the periphery side of the frame;
    wherein both of the at least one second opening of the frame, the at least one electrical connection port, and a place where the at least one electrical connection port connects to the external circuit board are arranged in one direction, and the direction is substantially perpendicular to a surface of the circuit board, and the surface is substantially paralleled to the rear side,
    wherein the at least one electrical connection port, is corresponding to the at least one second opening and passes through the at least one second opening, and is exposed to the outside of the frame, wherein an area of the at least one electrical connection port is located inside the area of the one of the parts of the frame.

2. The backlight module of the claim 1, wherein the at least one electrical connection port comprises an elastic conductor.

3. The backlight module of the claim 1, wherein the at least one electrical connection port comprises a metal elastic plate.

4. The backlight module of the claim 1, wherein the at least one electrical connection port is curved.

5. The backlight module of the claim 1, wherein the at least one electrical connection port comprises bare copper.

6. The backlight module of the claim 1, wherein the circuit board comprises a flexible printed circuit board or printed circuit board.

7. A flat panel display, comprising:
    a backlight module of claim 1; and
    an another circuit board comprising at least one another electrical connection port being connected with the electrical connection port in the backlight module of claim 1.

8. A backlight module, comprising:
    a frame, having a rear side and a periphery side, comprising at least one first opening and a picture frame-shaped area being projected on a plane and the picture frame-shaped area surrounding the at least one first opening in the rear side, wherein one portion of the picture frame-shaped area has at least one second opening thereinside, in the rear side;
    a circuit board, disposed on the one portion of the picture frame-shaped area, and an area of the circuit board is located inside the one portion of the picture frame-shaped area; and
    at least one electrical connection port, disposed on the circuit board, connecting the circuit board and an external circuit board on the rear side, and not extending out of the periphery side of the frame;
    wherein both of the at least one second opening of the frame, the at least one electrical connection port, and a place where the at least one electrical connection port connects to the external circuit board are arranged in one direction, and the direction is substantially perpendicular to a surface of the circuit board, and the surface is substantially paralleled to the rear side,
    wherein the at least one electrical connection port, is corresponding to the at least one second opening and passes through the at least one second opening, and is exposed to the outside of the frame, wherein an area of the at least one electrical connection port is located inside the one portion of the picture frame-shaped area.

9. The backlight module of the claim 8, wherein the at least one electrical connection port comprises an elastic conductor.

10. The backlight module of the claim 8, wherein the at least one electrical connection port comprises a metal elastic plate.

11. The backlight module of the claim 8, wherein the at least one electrical connection port is curved.

12. The backlight module of the claim 8, wherein the at least one electrical connection port comprises bare copper.

13. The backlight module of the claim 8, wherein the circuit board comprises a flexible printed circuit board or printed circuit board.

* * * * *